United States Patent
Hung et al.

(10) Patent No.: US 8,390,073 B2
(45) Date of Patent: *Mar. 5, 2013

(54) TRANSISTOR STRUCTURE

(75) Inventors: Wen-Han Hung, Kaohsiung (TW);
Tsai-Fu Chen, Hsinchu (TW);
Shyh-Fann Ting, Tai-Nan (TW);
Cheng-Tung Huang, Kao-Hsiung (TW);
Kun-Hsien Lee, Tai-Nan (TW);
Ta-Kang Lo, Taoyuan County (TW);
Tzyy-Ming Cheng, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/450,444

(22) Filed: Apr. 18, 2012

(65) Prior Publication Data

US 2012/0199890 A1    Aug. 9, 2012

Related U.S. Application Data

(63) Continuation of application No. 12/502,239, filed on Jul. 14, 2009, now Pat. No. 8,183,640.

(51) Int. Cl.
*H01L 29/76* (2006.01)
*H01L 29/94* (2006.01)

(52) U.S. Cl. ......... 257/369; 257/344; 438/231; 438/301

(58) Field of Classification Search .................. 257/369, 257/344, E21.619, E29.266; 438/231, 300–301, 438/199
See application file for complete search history.

(56) References Cited

U.S. PATENT DOCUMENTS

| 7,242,063 B1 | 7/2007 | Chow |
| 8,183,640 B2 * | 5/2012 | Hung et al. ................... 257/369 |
| 2007/0020839 A1 | 1/2007 | Sridhar |
| 2007/0184600 A1 | 8/2007 | Zhang |
| 2008/0085577 A1 | 4/2008 | Shih |

* cited by examiner

*Primary Examiner* — Theresa T Doan
(74) *Attorney, Agent, or Firm* — Winston Hsu; Scott Margo

(57) ABSTRACT

A transistor structure is provided in the present invention. The transistor structure includes: a substrate comprising a P-type well, a gate disposed on the P-type well, a first spacer disposed on the gate, an N-type source/drain region disposed in the substrate at two sides of the gate, a silicon cap layer covering the N-type source/drain region, a second spacer around the first spacer and the second spacer directly on and covering a portion of the silicon cap layer and a silicide layer disposed on the silicon cap layer.

8 Claims, 5 Drawing Sheets

TRANSISTOR STRUCTURE

CROSS REFERENCE TO RELATED APPLICATIONS

This patent application is a continuation application of and claims priority to U.S. patent application Ser. No. 12/502,239, filed on Jul. 14, 2009, and entitled "Method of fabricating transistors and a transistor structure for improving short channel effect and drain induced barrier lowering," the entire contents of which are incorporated herein by reference

BACKGROUND OF THE INVENTION

1. Field of the Invention

The present invention relates to a method of manufacturing a semiconductor device, and a semiconductor structure thereof for improving short channel effect and drain induced barrier lowering, and more particularly, to a method of manufacturing MOS transistors, and a MOS structure thereof that improves short channel effect and drain induced barrier lowering.

2. Description of the Prior Art

For decades, chip manufacturers have made metal-oxide-semiconductor (MOS) transistors faster by making them smaller. As the semiconductor processes advance to the very deep sub micron era such as 65-nm node or beyond, how to increase the driving current for MOS transistors has become a critical issue.

To attain higher performance of a semiconductor device, attempts have been made to use a strained silicon (Si) layer for increasing the mobility of electrons or holes. For example, taking advantage of the lattice constant of SiGe layer being different from that of Si, a strain occurs in the silicon layer growing on the SiGe layer. Since SiGe has a larger lattice constant than Si, the band structure of Si is altered, thereby increasing the mobility of the carriers.

Other attempts have been made to use germanium embedded in a predetermined source/drain region formed by selective epitaxial growth as a compressive strained silicon film to enhance electron mobility in a PMOS transistor, after a gate is formed. An SiGe layer deposited into the predetermined source/drain region often increases the mobility of electron holes of PMOS, but will simultaneously decrease the electron mobility of an NMOS and reduce the efficiency of the transistor. Therefore, during SiGe layer formation, NMOS is usually covered by a silicon nitride layer serving as a mask. After the SiGe layer is formed, the silicon nitride layer will be removed by hot phosphoric acid. However, the surface of the substrate where the predetermined source/drain region of NMOS is disposed will be corroded by hot phosphoric acid. The interface between the gate dielectric layer and the substrate is taken as a reference. The baseline of corroded substrate becomes lower than the aforesaid interface. Therefore, after the implantation process to form a source/drain region, the p/n junction will become deeper than a predetermined depth. As a result, short channel effect and drain induced barrier lowering (DIBL) effect will occur.

Therefore, there is still a need for a MOS transistor device and a method of manufacturing the same to improve problems mentioned above.

SUMMARY OF THE INVENTION

It is therefore an objective of the present invention to provide a method of fabricating MOS transistors to solve the lowering of the baseline where the predetermined source/drain region of NMOS is disposed after removing a mask.

According to the present invention, a method of fabricating method of fabricating transistors comprises the following steps. First, a substrate comprising a first type well and a second type well is provided. Then, a first gate on the first type well and a second gate on the second type well are formed respectively. After that, a third spacer is formed on the first gate. Later, an epitaxial layer is formed in the substrate at two sides of the first gate. Next, a fourth spacer is formed on the second gate. Subsequently, a silicon cap layer is formed to cover the epitaxial layer, and the surface of the substrate at two sides of the second gate. Then, a first source/drain region is formed in the substrate at two sides of the first gate. Finally, a second source/drain region is formed in the substrate at two sides of the second gate.

According to the present invention, a transistor structure for improving short channel effect and drain induced barrier lowering comprises: a substrate comprising a P-type well; a gate disposed on the P-type well; a spacer disposed on the gate; a N-type source/drain region disposed in the substrate at two sides of the gate; a silicon cap layer covering the N-type source/drain region; and a silicide layer disposed on the silicon cap.

The feature of the present invention is that, after forming the epitaxial layer, a silicon cap layer is formed at two sides of the gate of NMOS and PMOS respectively. In other words, the silicon cap layer is formed on the surface of the source/drain region of the NMOS and PMOS. The silicon cap layer can level up the baseline of the source/drain region of the NMOS after the mask is removed. In this way, the short channel effect and the drain induced barrier lowering effect can be prevented because the depth of the p/n junction is maintained at a predetermined depth. Furthermore, the epitaxial layer will become a spacer of the NMOS after the epitaxial layer is formed.

These and other objectives of the present invention will no doubt become obvious to those of ordinary skill in the art after reading the following detailed description of the preferred embodiment that is illustrated in the various figures and drawings.

DETAILED DESCRIPTION

FIG. 1 through FIG. 9 are schematic cross-section view diagrams showing the means of fabricating transistors according to the present invention.

Figure 1:
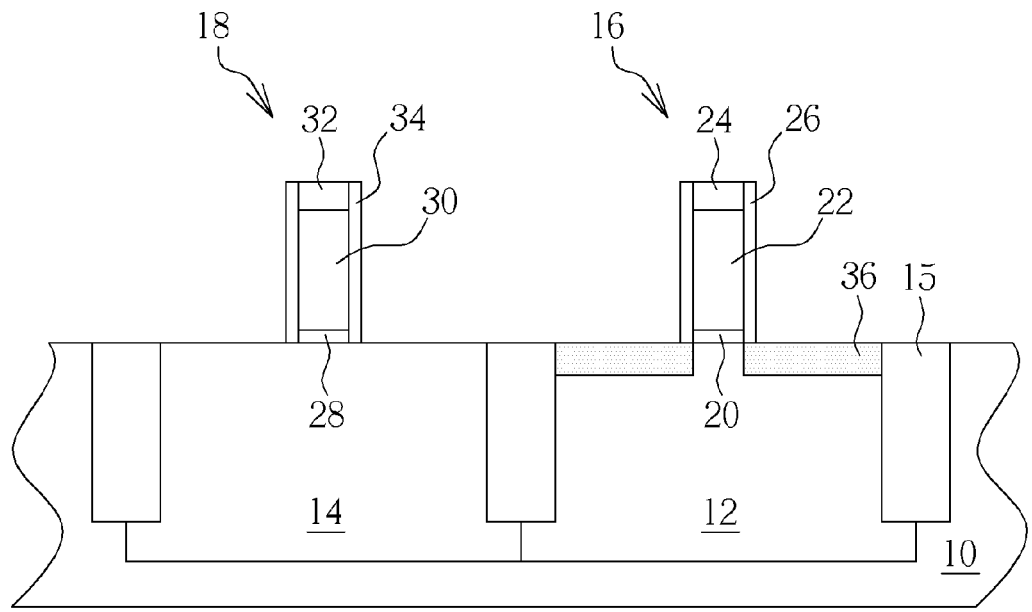
FIG. 1 through FIG. 9 are schematic cross-section view diagrams showing the means of fabricating transistors according to the present invention.

As shown in FIG. 1, first, a substrate 10 comprising a first type well 12 and a second type well 14 are provided. The first type well 12 may be an N type or P type, and the second type well 14 may be a P type or N type. The following illustration will take the first type well 12 as an N type well, and the second type well 14 as a P type well. In other words, a PMOS will be formed on the first type well 12 and a NMOS will be formed on the second type well 14. In addition, a shallow trench isolation (STI) 15 is disposed between the first type well 12 and the second type well 14, and around the first type well 12 and the second type well 14 within the semiconductor substrate 10.

Next, a first gate 16 and a second gate 18 are formed on the first type well 12 and the second type well 14, respectively. The first gate 16 includes a first dielectric layer 20 positioned on the substrate 10, a first conductive layer 22 positioned on the first dielectric layer 20, a first cap layer 24 positioned on the first conductive layer 22 and a first spacer 26 positioned on the sidewalls of the first dielectric layer 20, the first conductive layer 22 and the first cap layer 24. The second gate 18 includes a second dielectric layer 28 positioned on the substrate 10, a second conductive layer 30 positioned on the second dielectric layer 28, a second cap layer 32 positioned on the second conductive layer 30 and a second spacer 34 positioned on the sidewalls of the second dielectric layer 28, the second conductive layer 30 and the second cap layer 32. Generally, the first dielectric layer 20 and the second dielectric layer 28 are composed of silicon dioxide, or a material with a high dielectric constant that is greater than 4. The first conductive layer 22 and the second conductive layer 30 are composed of doped polysilicon, or a metal with specific work function. The first cap layer 24 and the second cap layer 32 are composed of silicon nitride. The first cap layer 24 and the second cap layer 32 can be formed optionally. The first spacer 26 and the second spacer 34 are for forming lightly doped regions of the drain/source regions. After the lightly doped regions are formed, the spacers may be kept in the structure or removed. Next, the first gate 16 is taken as a mask to form a first lightly doped region 36 in the substrate 10 at two sides of the first gate 16.

Figure 2:
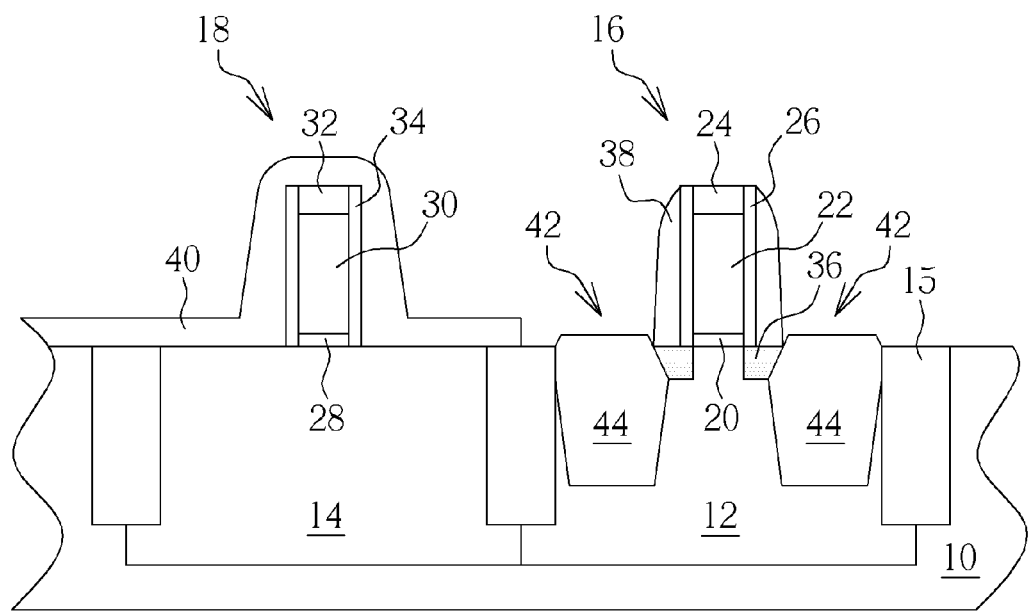

After that, as shown in FIG. 2, a third spacer 38 is formed at the sidewall of the first gate 16. During the formation of the third spacer 38, a mask layer 40 covering the second type well 14 and the second gate 18 is formed simultaneously. The method of forming the third spacer 38 and the mask layer 40 may includes the following steps. First, a silicon nitride layer is formed to cover the first type well 12, the second type well 14, the first gate 16, and the second gate 18. Then, a patterned photoresist (not shown) is formed to cover the second type well 14 and the second gate 18. After that, the silicon nitride layer not covered by the patterned photoresist is removed by an etching process to form the third spacer 38. Finally, the patterned photoresist is removed. The silicon nitride layer originally covered by the patterned photoresist becomes the mask layer 40.

Figure 3:
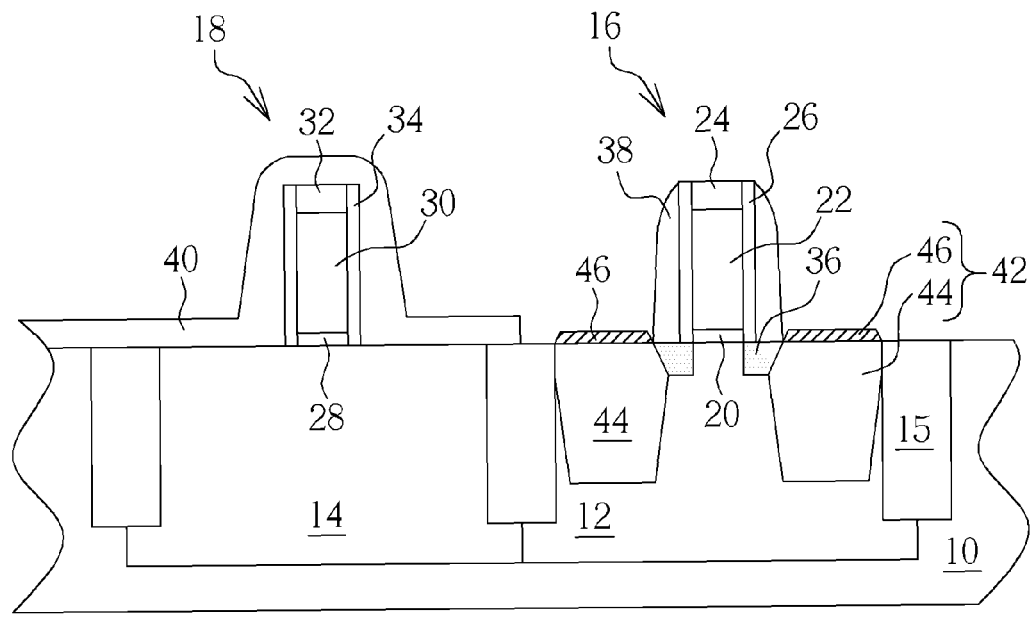

Next, an epitaxial layer 42 is formed in the substrate 10 at two sides of the first gate 16. According to a preferred embodiment of the present invention, the epitaxial layer 42 includes only a SiGe epitaxial layer 44 as shown in FIG. 2. According to another preferred embodiment of the present invention, the epitaxial layer 42 includes both a SiGe epitaxial layer 44 and a single crystalline silicon 46 formed on the SiGe epitaxial layer 44, as shown in FIG. 3. Preferably, the SiGe epitaxial layer 44 can be formed by an embedded Silicon Germanium (e-SiGe) process. For example, the mask layer 40, the first gate 16 and the third spacer are taken as a mask to form two recesses at two sides of the first gate 16 by an etching process. After that, silicon-containing gas and germanium-containing gas flow into the chamber and the SiGe epitaxial layer 44 grows in the two recesses. According to another preferred embodiment, the germanium-containing gas is turned off when the SiGe epitaxial layer 44 reaches a predetermined height. Then, the single crystalline silicon 46 can be formed on the SiGe epitaxial layer 44. The thickness of the single crystalline silicon 46 can be adjusted according to product design, and the single crystalline silicon 46 can even be omitted according to different requirements. Additionally, the concentration of germanium in the SiGe epitaxial layer 44 can be controlled to form a gradient in the SiGe epitaxial layer 44.

Figure 5:
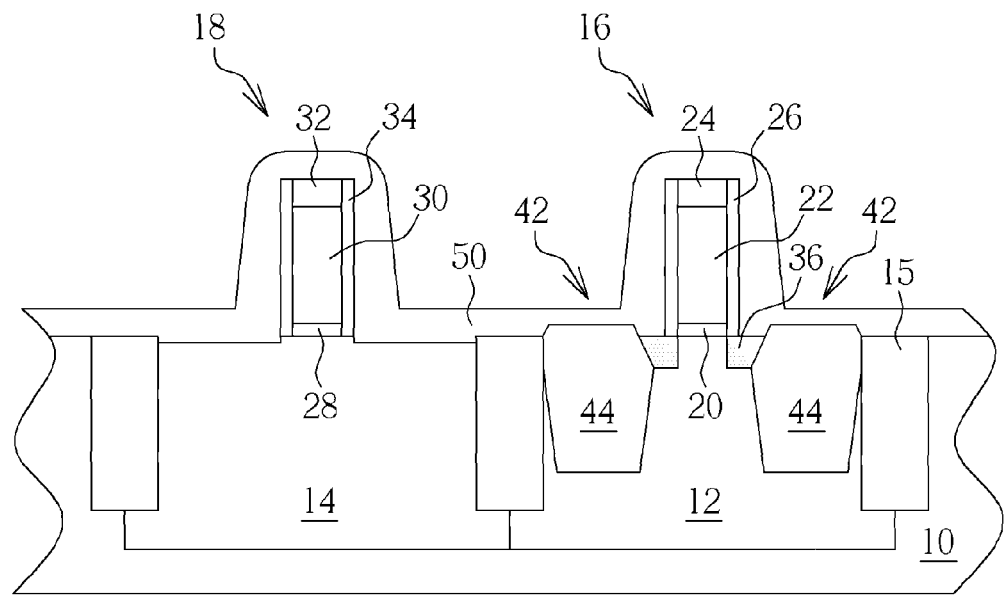
Figure 6:
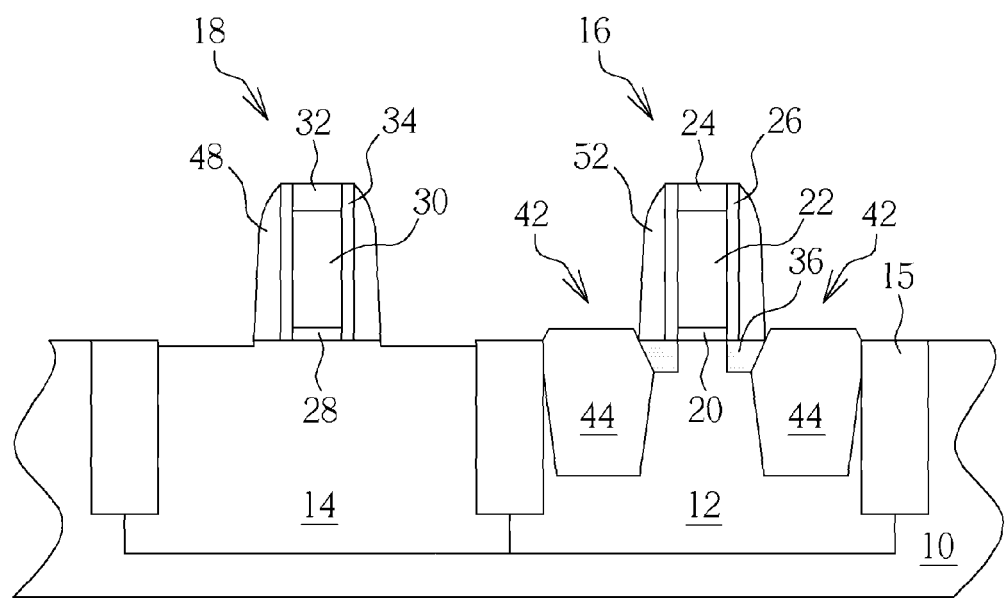

After the embedded Silicon Germanium (e-SiGe) process is finished, a patterned photoresist (not shown) is formed to cover the first type well 12, the first gate 16 and the third spacer 38. Then, the mask layer 40 is etched partly to form a fourth spacer 48 on the sidewall of the second gate 18. Next, the patterned photoresist is removed. According to another preferred embodiment of forming the fourth spacer 48, the method includes the following steps. First, the third spacer 38 and the mask layer 40 are removed completely. Next, as shown in FIG. 5, a material layer 50 is covered on the second type well 14, the first type well 12, the first gate 16 and the second gate 18 conformally. As shown in FIG. 6, a part of the material layer 50 is removed to form a seventh spacer 52 and the fourth spacer 48. The process of forming spacers only demonstrates the preferred embodiment of the present invention. Other modifications and alterations may be made by those skilled in the technology without departing from the spirit of the invention.

Figure 4:
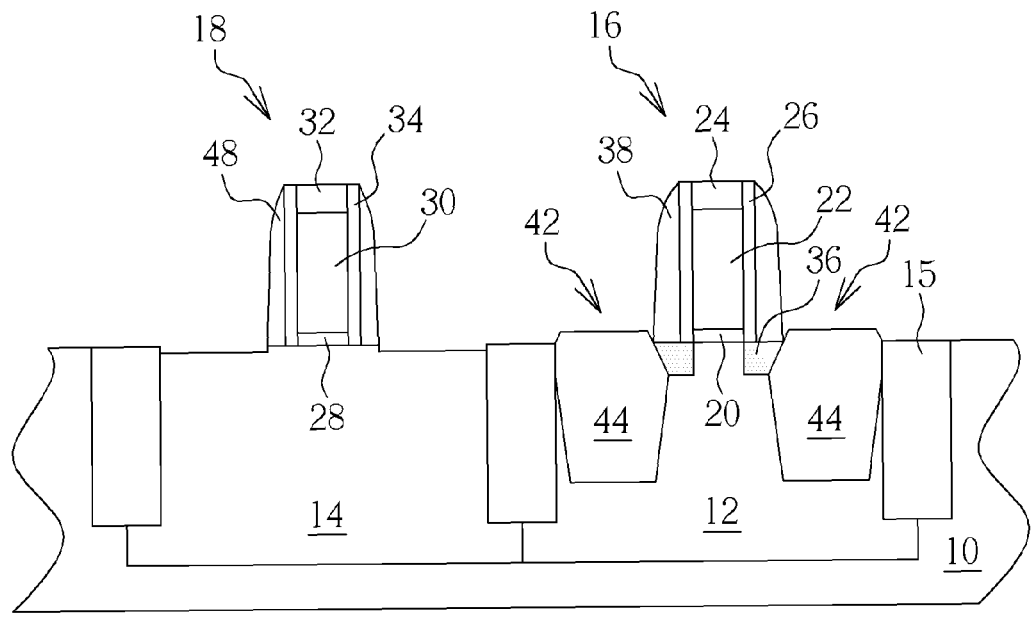

The following processes continue on from the process in FIG. 4, i.e. in the following, the processes shown in FIG. 5 and FIG. 6 have not been performed.

Figure 7:
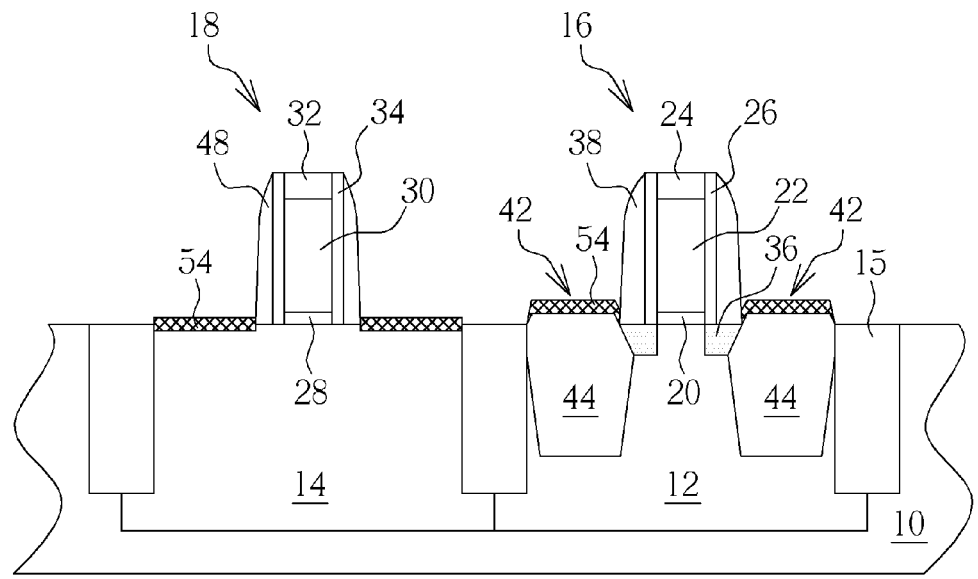

As shown in FIG. 7, a silicon cap layer 54 is formed on the surface of the epitaxial layer 42 and the surface of the substrate 10 at two sides of the first second 18. In other words, the silicon cap layer 54 is formed on the predetermined source/drain region in the first type well 12 and the second type well 14. The silicon cap layer 54 can be single crystalline silicon. For example, the silicon cap layer 54 can be formed by using the same method as that used by the epitaxial layer 42. The silicon cap layer 54 can even be formed by putting the substrate 10 into the same chamber as used by the epitaxial layer 42, and turning on the silicon-containing gas again to form the silicon cap layer 54. According to a preferred embodiment of the present invention, the thickness of the silicon cap layer 54 is 50 to 150 angstroms.

Figure 8:
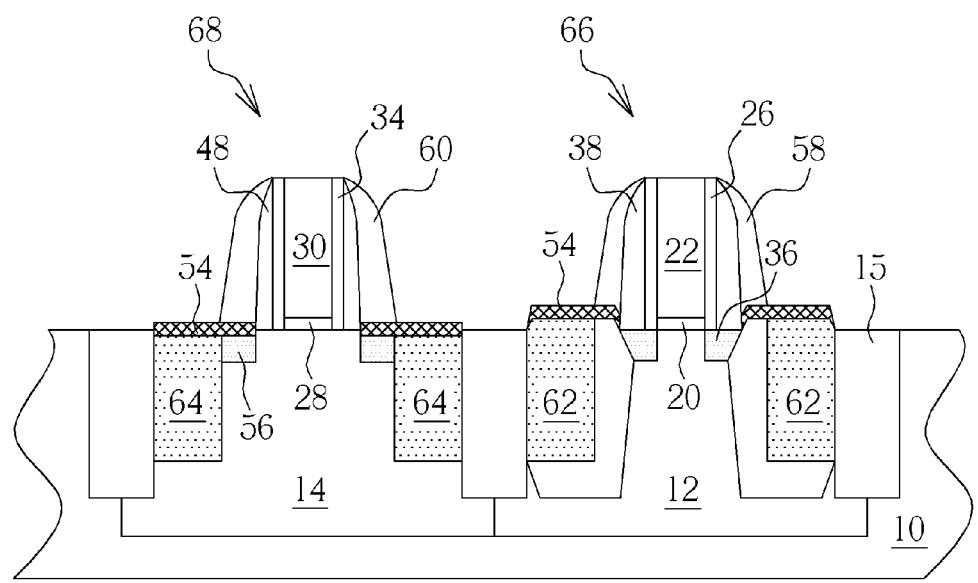

As shown in FIG. 8, a patterned photoresist (not shown) covers the first type well 12. The patterned photoresist, the fourth spacer 48 and the second gate 18 are taken as masks to perform an implantation process. After the implantation process, a second lightly doped region 56 is formed in the substrate 10 at two sides of the second gate 18. Then, a fifth spacer 58 and a sixth spacer 60 are formed on the sidewalls of the third spacer 38 and the fourth spacer 48, respectively. After that, the first cap layer 24 and the second cap layer 32 are removed to expose the first conductive layer 22 and the second conductive layer 30. Subsequently, a P-typed first source/drain region 62 is formed in the substrate 10 at two sides of the first gate 16, and an N-typed second source/drain region 64 is formed in the substrate 10 at two sides of the second gate 18. At this point, the PMOS 66 and NMOS 68 of the present invention are completed. The fabricating sequence of the first source/drain region 62 and the second type source/drain region 64 can be exchanged. Additionally, the first source/drain region 62 may partly overlap with the epitaxial layer 42.

Figure 9:
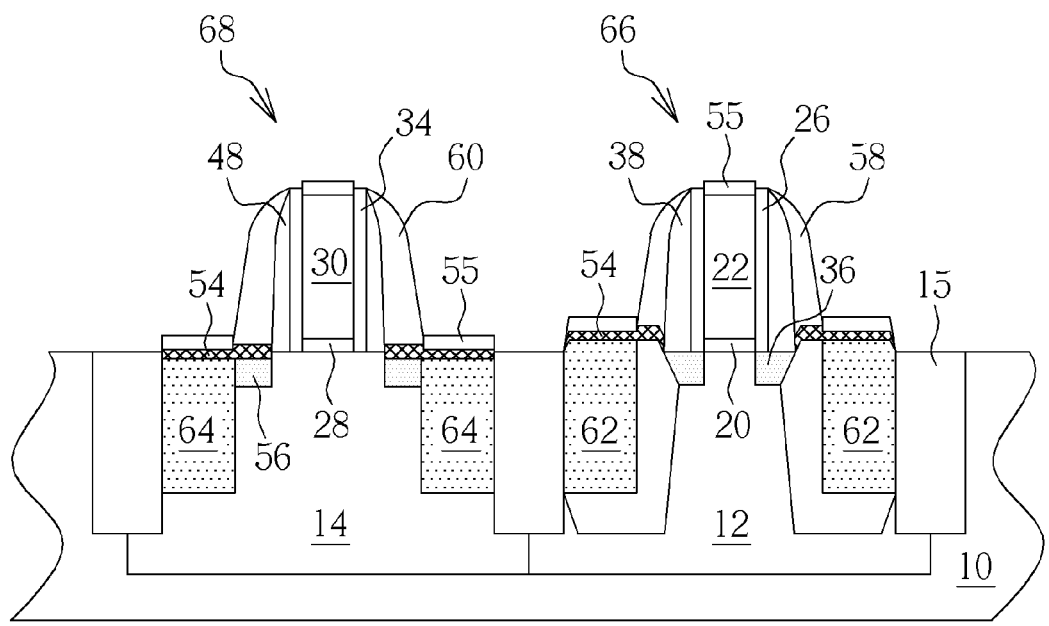

As show in FIG. 9, a silicide process is performed to transform at least part of the exposed first conductive layer 22, part of the exposed second conductive layer 30, and part of the silicon cap layer 54 to become a silicide layer 55. After that, other fabricating processes such as forming a contact etch stop layer (CESL), a dual stress liner (DSL), or other stress memorization technology (SMT) can also be applied to the present invention to increase the performance of the MOS.

Then, an inter circuit process can be performed on the PMOS and NMOS: for example, forming an inter layer dielectric covering the PMOS 66 and NMOS 68. Next, contact plugs can be formed in the inter layer dielectric to contact the first gate 16, the second gate 18, the first source/drain doped region 62 and the second source/drain doped region 64. In addition, the present invention can also be applied to the embedded silicon carbon (e-SiC) to improve the performance of the NMOS. For example, when performing the process shown in FIG. 2 or FIG. 3, the SiGe epitaxial layer is replaced with a SiC epitaxial layer.

In the process mentioned above, at least part of the mask layer 40 will be removed after the epitaxial layer 42 is formed. After removing part of the mask layer 40, the surface of the substrate 10 at two sides of the second gate 18 is also etched. Therefore, by taking the interface of the second dielectric layer 28 and the substrate 10 as reference, the baseline of the surface of the substrate 10 at two sides of the second gate 18 is leveled down. The feature of the present invention is that the silicon cap layer 54 is formed on the two sides of the first gate 16 and the second gate 18. In other words, the silicon cap layer 54 is formed on the source/drain doped region of the PMOS 66 and NMOS 68. For the NMOS 68, the silicon cap layer 54 can refill the region of the substrate 10 that is etched along with the mask layer 40. In other words, the baseline of the substrate 10 at two sides of the second gate 18 is leveled up. The short channel effect and drain induced barrier lowering effect can be prevented because the p/n junction is maintained at a predetermined depth. For the PMOS 66, the silicon cap layer 54 is primarily for the formation of the silicide layer 55. In addition, after the epitaxial layer 42 is formed, the mask layer 40 can be used as a spacer of the NMOS 68.

Figure 10:
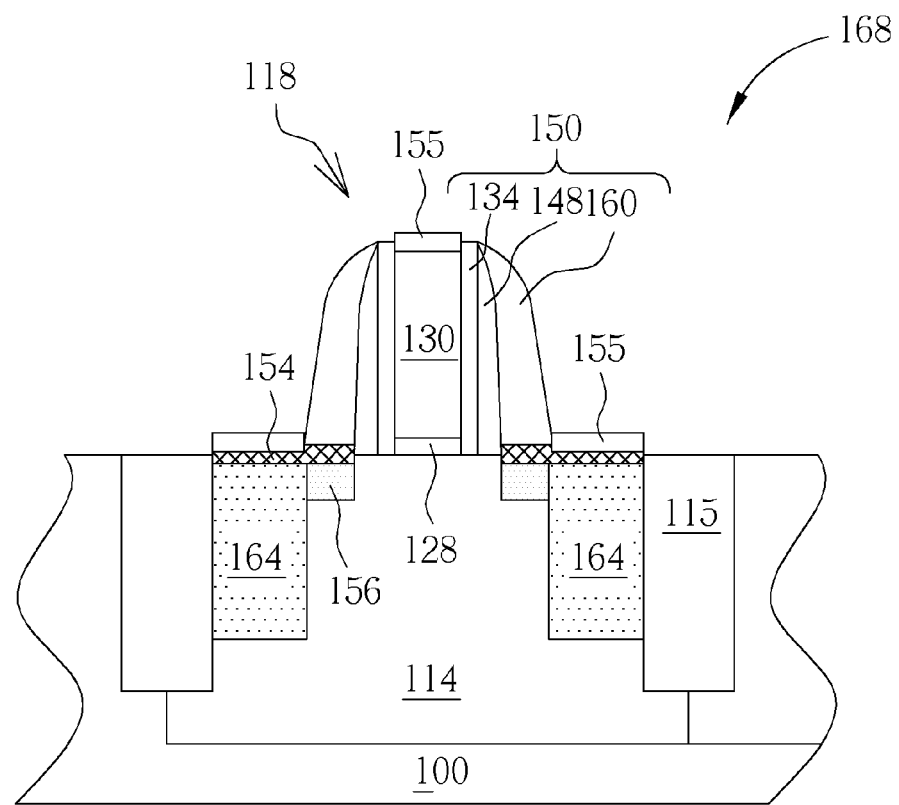
FIG. 10 shows a schematic cross-section view diagram of a transistor structure for improving short channel effect and drain induced barrier lowering according to the present invention.

FIG. 10 shows a schematic cross-section view diagram of a transistor structure for improving short channel effect and drain induced barrier lowering according to the present invention.

As shown in FIG. 10, the NMOS 168 of the present invention includes: a substrate 100 comprising a P-type well 114, a gate 118 disposed on the P-type well 114, a spacer 150 disposed on the gate 118, a lightly doped region 156 disposed in the substrate 100 below the spacer 150, an N-type source/drain region 164 disposed in the substrate 100 at two sides of the gate 118, a silicon cap layer 154 covering the N-type source/drain region 164 and a silicide layer 155 disposed on the silicon cap layer 154. The gate 118 includes a dielectric layer 128 positioned on the substrate 100 and a conductive layer 130 positioned on the dielectric layer 128. In addition, the spacer 150 is a composite and the spacer 150 includes spacers 134, 148, 160 positioned on the sidewall of the gate 118. Furthermore, the thickness of the silicon cap layer 154 is 50 to 150 angstroms, and the silicon cap layer 154 consists of single crystalline silicon. Moreover, the surface of the silicide layer 155 is more elevated than the interface between the dielectric layer 128 and the substrate 100.

As a result, the feature of the present invention is that a silicon cap layer 154 is at the source/drain region 164 of the NMOS 168. Therefore, the short channel effect and drain induced barrier lowering effect can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A transistor structure, comprising:
   a substrate comprising a P-type well;
   a gate disposed on the P-type well;
   a first spacer disposed on the gate;
   an N-type source/drain region disposed in the substrate at two sides of the gate;
   a silicon cap layer covering the N-type source/drain region;
   a second spacer around the first spacer and the second spacer directly on and covering a portion of the silicon cap layer;
   a lightly doped region in the substrate below the second spacer; and
   a silicide layer disposed on the silicon cap layer.

2. The transistor structure of claim 1, wherein the thickness of the silicon cap layer is 50 to 150 angstroms.

3. The transistor structure of claim 1, wherein the gate comprises a dielectric layer on the substrate and a conductive layer on the dielectric layer.

4. The transistor structure of claim 1, wherein the surface of the silicide layer is more elevated than the interface between the dielectric layer and the substrate.

5. A transistor structure, comprising:
   a substrate comprising a P-type well;
   a gate disposed on the P-type well;
   a first spacer disposed on the gate;
   a second spacer around the first spacer;
   a lightly doped region in the substrate below the second spacer:
   an N-type source/drain region disposed in the substrate at two sides of the gate;
   a silicon cap layer covering the N-type source/drain region and the lightly doped region; and
   a silicide layer disposed on the silicon cap layer, and covering only a portion of the silicon cap layer.

6. The transistor structure of claim 5, wherein the thickness of the silicon cap layer is 50 to 150 angstroms.

7. The transistor structure of claim 5, wherein the gate comprises a dielectric layer on the substrate and a conductive layer on the dielectric layer.

8. The transistor structure of claim 5, wherein the surface of the silicide layer is more elevated than the interface between the dielectric layer and the substrate.

* * * * *